(12) United States Patent
Huang et al.

(10) Patent No.: US 8,278,196 B2
(45) Date of Patent: Oct. 2, 2012

(54) HIGH SURFACE DOPANT CONCENTRATION SEMICONDUCTOR DEVICE AND METHOD OF FABRICATING

(75) Inventors: Yu-Lien Huang, Jhubei (TW); Mao-Rong Yeh, Tao Yuan (TW); Chun Hsiung Tsai, Xinpu Township, Hsinchu County (TW); Tsung-Hung Lee, Hsinchu (TW); Da-Wen Lin, Hsinchu (TW); Tsz-Mei Kwok, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 197 days.

(21) Appl. No.: 12/840,830

(22) Filed: Jul. 21, 2010

(65) Prior Publication Data

US 2012/0018848 A1   Jan. 26, 2012

(51) Int. Cl.
  *H01L 21/425* (2006.01)
(52) U.S. Cl. ........ 438/513; 438/530; 438/682; 438/926; 257/E21.336
(58) Field of Classification Search .................. 438/926
  See application file for complete search history.

(56) References Cited

U.S. PATENT DOCUMENTS

| | | | |
|---|---|---|---|
| 6,706,571 B1 | 3/2004 | Yu et al. | |
| 6,812,086 B2 * | 11/2004 | Murthy et al. | 438/231 |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,582,535 B2 * | 9/2009 | Lee et al. | 438/300 |
| 7,605,449 B2 | 10/2009 | Liu et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2007/0254421 A1 * | 11/2007 | Tsai et al. | 438/197 |
| 2008/0054347 A1 * | 3/2008 | Wang | 257/327 |
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |
| 2009/0035909 A1 | 2/2009 | Chang et al. | |
| 2009/0181477 A1 | 7/2009 | King et al. | |
| 2010/0006945 A1 | 1/2010 | Merelle et al. | |
| 2010/0006974 A1 | 1/2010 | Xu et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Stephen W Smoot
(74) *Attorney, Agent, or Firm* — Haynes and Boone, LLP (57) ABSTRACT

The present disclosure provides a high surface dopant concentration semiconductor device and method of fabricating. In an embodiment, a method of forming the semiconductor device includes providing a substrate, forming a doped region in the substrate, forming a stressing layer over the doped region, performing a boron (B) doping implant to the stressing layer, annealing the B doping implant, and after annealing the B doping implant, forming a silicide layer over the stressing layer.

14 Claims, 5 Drawing Sheets

U.S. PATENT DOCUMENTS

| | | |
|---|---|---|
| 2010/0052059 A1 | 3/2010 | Lee |
| 2010/0112798 A1 | 5/2010 | Lai et al. |
| 2010/0183961 A1 | 7/2010 | Shieh et al. |
| 2010/0203734 A1 | 8/2010 | Shieh et al. |
| 2010/0210084 A1* | 8/2010 | Yang et al. ............... 438/285 |
| 2010/0264468 A1 | 10/2010 | Xu |
| 2011/0073952 A1* | 3/2011 | Kwok et al. ............. 257/368 |
| 2011/0111571 A1* | 5/2011 | Tsai et al. ............... 438/305 |
| 2011/0256681 A1* | 10/2011 | Lin et al. ............... 438/285 |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film For A Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process For Fabricating Finfet Device," filed Apr. 8, 2010, 38 pages.

Ming-Lung Cheng, et al. U.S. Appl. No. 12/780,124, "Method and Apparatus For Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit For Finfet Devices," filed Jun. 30, 2010, 32 pages.

Jhon Jhy Liaw, U.S. Appl. No. 12/823,860, "Structure And Method For SRAM Cell Circuit," filed Jun. 25, 2010, 37 pages.

Jhon Jhy Liaw, et al., U.S. Appl. No. 12/827,690, "Layout For Multiple-Fin SRAM Cell," filed Jun. 30, 2010, 35 pages.

Jeng-Jung Shen, et al., U.S. Appl. No. 12/780,060, "Automatic Layout Conversion For Finfet Device," filed May 14, 2010, 29 pages.

Jeng-Jung Shen, et al., U.S. Appl. No. 12/780,426, "Finfet Boundary Optimization," filed May 14, 2010, 28 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device And Method of Manufacturing Same," filed Oct. 18, 2010, 55 pages.

Jeff J. Csu, et al, U.S. Appl. No. 12/917,902, "Fin-Like Field Effect Transistor (FINFET) Device And Method Of Manufacturing Same," filed Nov. 2, 2010, 61 pages.

Mark van Dal, U.S. Appl. No. 12/900,895, "Method Of Fabricating A Semiconductor Device Having An Epitaxly Region," filed Oct. 8, 2010, 21 pages.

Hsin-Chih Chen, et al, U.S. Appl. No. 12/907,272, "Multi-Fin Device By Self-Aligned Castle Fin Formation," filed Oct. 19, 2010, 34 pages.

Chien-Hsun Wang, et al, U.S. Appl. No. 12/952,376, "Method For Adjusting Fin Width In Integrated Circuitry," filed Nov. 23, 2010, 27 pages.

Chien-Shun Wang, et al, U.S. Appl. No. 12/949,881, "Method For Forming Metrology Structures From Fins In Integrated Circuitry," filed Nov. 19, 2010, 16 pages.

Chien-Hsun Wang, et al, U.S. Appl. No. 12/953,148, "Device And Method For Forming Fins In Integrated Circuitry," filed Nov. 23, 2010, 39 pages.

* cited by examiner

HIGH SURFACE DOPANT CONCENTRATION SEMICONDUCTOR DEVICE AND METHOD OF FABRICATING

BACKGROUND

The present disclosure relates generally an integrated circuit device and, more particularly, to a high surface dopant concentration semiconductor device and method of fabricating.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling-down causes a need for smaller device contacts. Smaller device contacts may lead to reduced device performance by having a relatively high resistance. Conventional methods fabricate such contacts using silicon germanium (SiGe) and provide a boron (B) implant using in-situ processes to reduce resistance. Benefits of such EPI in-situ implants are limited because they only produce a low concentration surface profile. In other words, conventional beam line implant can not deliver a high surface concentration dopant profile.

Thus, it is desirable to have an improved high surface dopant concentration semiconductor device and method of fabricating, which address one or more of the issues discussed above.

SUMMARY

An embodiment of the present disclosure provides a high surface dopant concentration semiconductor device and method of fabricating. The method includes forming the semiconductor device includes providing a substrate, forming a doped region in the substrate, forming a stressing layer over the doped region, performing a boron (B) doping implant to the stressing layer, annealing the B doping implant, and after annealing the B doping implant, forming a silicide layer over the stressing layer.

In another embodiment the present disclosure provides high surface dopant concentration semiconductor device and method of fabricating. This method includes providing a substrate, forming a dummy gate structure on the substrate, forming a doped region in the substrate, forming a stressing layer over the doped region, performing a boron (B) doping implant to the stressing layer, annealing the B doping implant, after annealing the B doping implant, forming a silicide layer over the stressing layer, and replacing the dummy gate structure with a metal gate structure.

In yet another embodiment the present disclosure provides a semiconductor device. The semiconductor device includes a substrate, a doped region formed in the substrate, a stressing layer formed over the doped region, a boron (B) dopant implanted into the stressing layer subsequently annealed, and a silicide layer formed over the stressing layer after the B dopant is annealed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
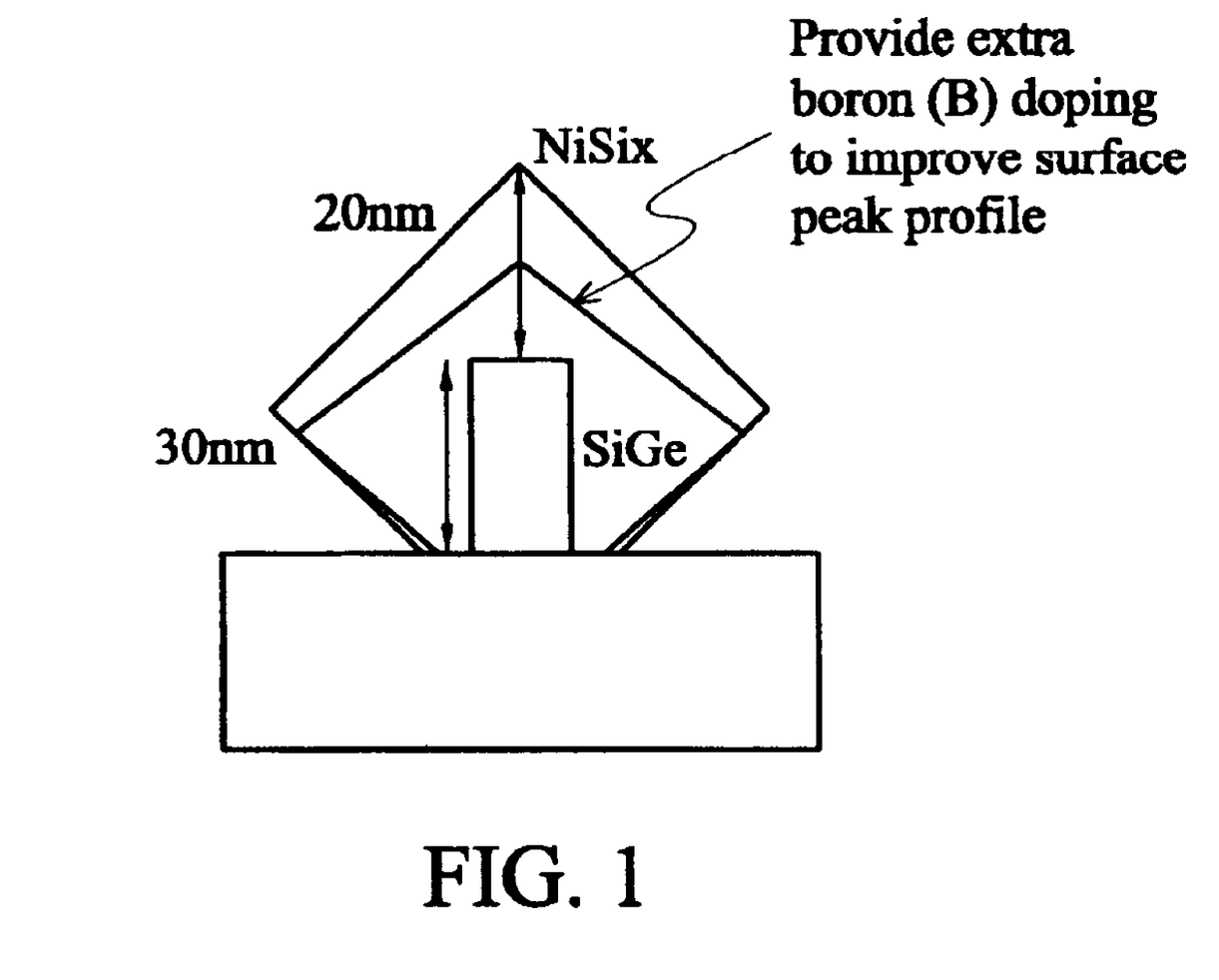
FIG. 1 illustrates an embodiment of a high surface dopant concentration semiconductor device according to the present disclosure.

The present disclosure relates generally to forming an integrated circuit device on a substrate and, more particularly, to fabricating such device having a high surface dopant concentration. One or more boron (B) implant processes are performed on the device after an SiGe formation and before a silicide (e.g. NiSix) deposition. This B implant process provides a high surface dopant concentration that is effective in reducing SiGe (contact) resistance (Rs), which in turn, boosts device performance and provides lower cost of ownership. See FIG. 1. Such additional B implants may include one or more of a plasma doping implant process, a low temperature implant process, and/or a cluster implant process. It is noted that the plasma implant provides the greatest device performance boost (e.g., ~6% gain) due to surface peak profile, while a low temperature implant processes and a cluster implant process provides a smaller device performance boost (e.g., ~2-3% gain). Such device may also have a gate structure as part of an integrated circuit (including FET devices). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials in both planar and finFET type devices.

Figure 2:
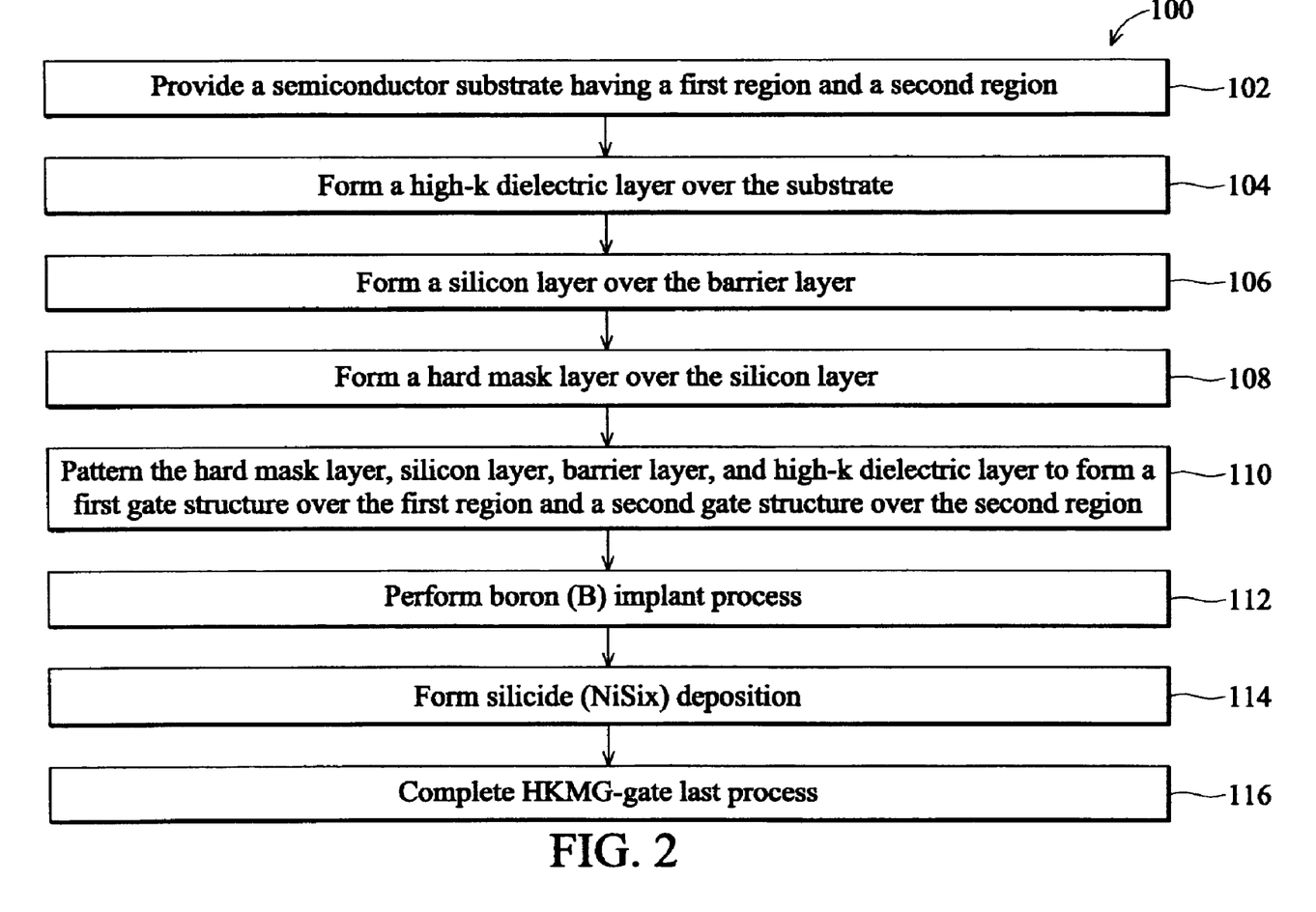
FIG. 2 illustrates a flowchart of an embodiment of a method for fabricating a semiconductor device according to various aspects of the present disclosure.
Figure 3:
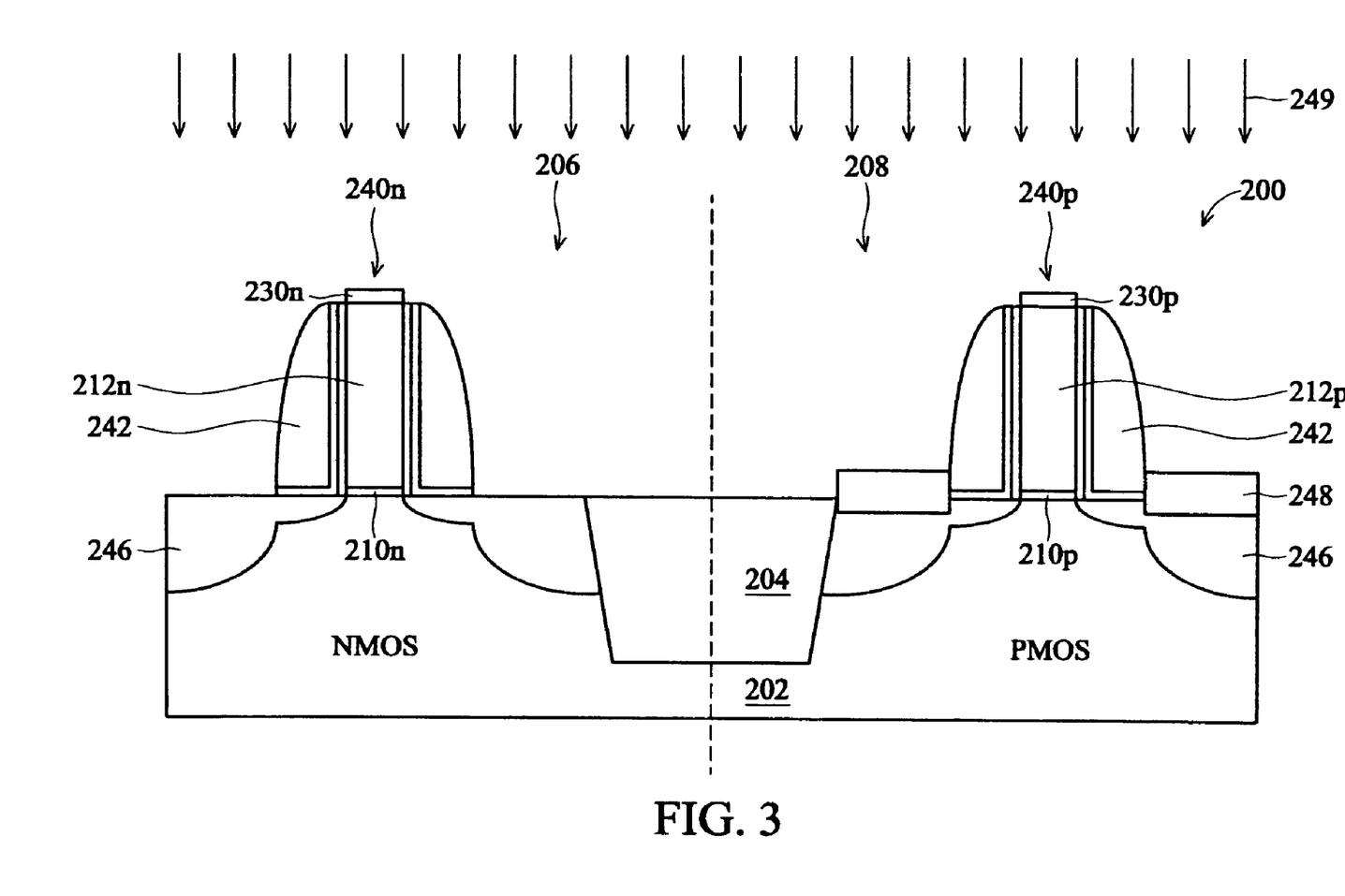
FIGS. 3 to 5 illustrate cross-sectional views of an embodiment of a semiconductor device at various stages of fabrication according to the method of FIG. 2.
Figure 4:
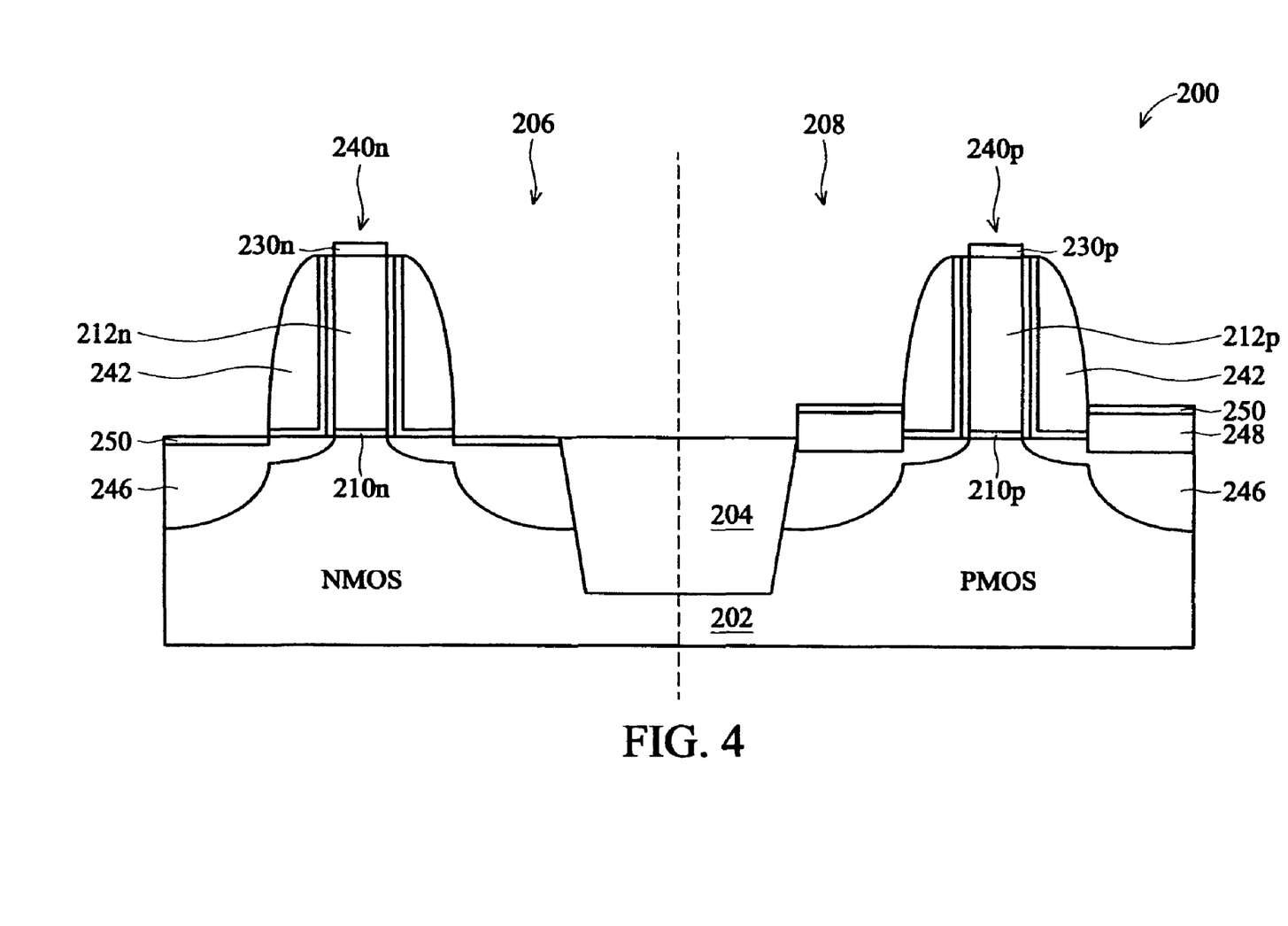
Figure 5:
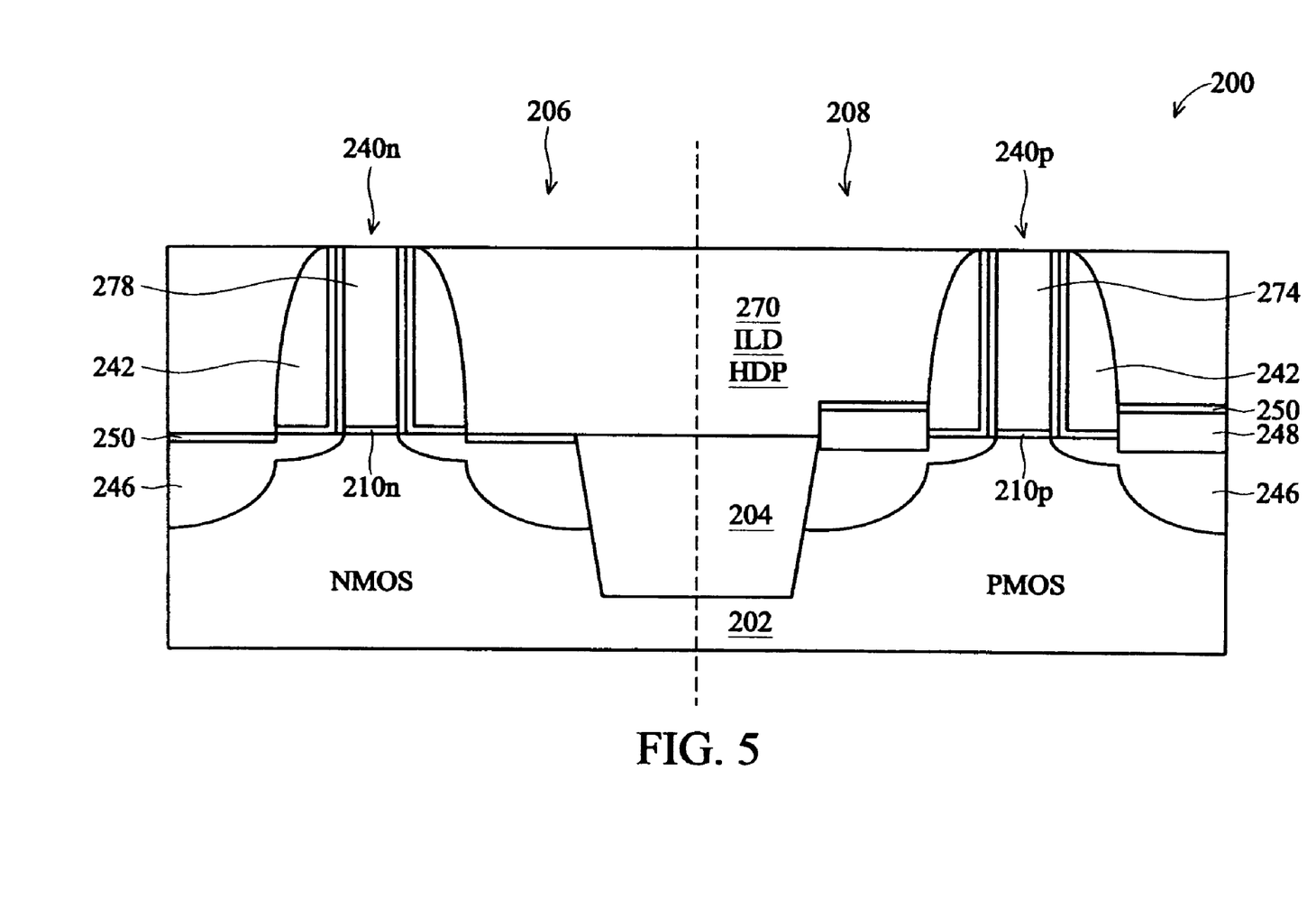

FIG. 2, illustrates a flowchart of an embodiment of a method 100 for fabricating a semiconductor device according to the present disclosure. Referring also to FIGS. 3-5 illustrated are cross-sectional views of a semiconductor device 200 at various stages of fabrication according to the method 100 of FIG. 2. The semiconductor device 200 may be an integrated circuit, or portion thereof, that may comprise static random access memory (SRAM) and/or logic circuits, passive components such as resistors, capacitors, and inductors, and active components such as P-channel field effect transistors (pFET), N-channel FET (nFET), metal-oxide semiconductor field effect transistors (MOSFET), complementary metal-oxide semiconductor (CMOS) transistors, or other devices.

It should be noted that some features of the semiconductor device 200 may be fabricated with a CMOS process flow. Accordingly, it is understood that additional processes may be provided before, during, and after the method 100 of FIG. 2, and that some other processes may only be briefly described herein. For example, the semiconductor 200 is illustrated in FIG. 3 following a silicon germanium (SiGe) formation and prior to forming silicide (e.g., NiSix) contact features on various doped regions, such as the source and drain regions of the device 200. Certain features discussed herein are shown in the figures having numbers followed by an "n" or a "p". Such indicators have no meaning other than the features discussed are relating to an N side or a P side of the device shown in the embodiment discussed.

The method 100 begins with block 102 in which a semiconductor substrate is provided, the substrate having a first region and a second region. For example, in FIG. 3, the semiconductor device 200 includes a substrate 202. The substrate 202 includes a silicon substrate (e.g., wafer) in crystalline structure. However, in other embodiments, other substrates may be used with the present disclosure. The substrate 202 may include various doping configurations depending on design requirements (e.g., p-type substrate and/or n-type substrate). Additionally, the substrate 202 may include various doped regions such as p-type wells (p-wells) or n-type wells (n-wells). Other examples of the substrate 202 may also include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and/or may include a silicon-on-insulator (SOI) structure.

The semiconductor device 200 includes isolation structures such as shallow trench isolation (STI) feature 204 formed in the substrate 202 to isolate one or more devices from each other. In the present embodiment, the STI feature 204 may isolate an nMOS device 206 and a pMOS device 208. The STI features 204 may include silicon oxide, silicon nitride, silicon oxynitride, fluoride-doped silicate glass (FSG), and/or a low k dielectric material. Other isolation methods and/or features are possible in lieu of or in addition to STI. The STI features 204 may be formed using processes such as reactive ion etch (RIE) or ICP of the substrate 202 to form trenches which are then filled with an insulator material using deposition processes followed by a CMP process.

The method 100 continues with block 104 in a high-k dielectric layer is formed over the semiconductor substrate. The semiconductor device 200 includes a gate dielectric 210 formed over the substrate. The gate dielectric 210 includes an interfacial layer. The interfacial layer may include a silicon oxide layer (e.g., thermal oxide or chemical oxide) having a thickness ranging from about 5 to about 10 angstrom (A). The gate dielectric 210 further includes a high dielectric constant (high-k) material layer formed on the interfacial layer. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium tantalum oxynitride (HfTaON), hafnium titanium oxide (HfTiO), hafnium titanium oxynitride (HfTiON), hafnium zirconium oxide (HfZrO), hafnium zirconium oxynitride (HfZrON), combinations thereof, and/or other suitable materials. The high-k dielectric layer may be formed by atomic layer deposition (ALD), chemical vapor deposition (CVD), or other suitable technique. The high-k dielectric layer may include a thickness ranging from about 10 to about 30 angstrom (A).

A barrier layer (not shown) may be formed over the high-k dielectric layer. In some embodiments, a barrier layer may optionally be formed over the high-k dielectric layer. The barrier layer may include TiN or TaN having a thickness ranging from abut 10 to about 50 angstrom (A). The barrier layer may be formed by various deposition techniques such as ALD, CVD, physical vapor deposition (PVD), or other suitable process.

The method 100 continues with block 106 in which a silicon layer is formed over the barrier layer. The semiconductor device 200 further includes a polysilicon (or poly) layer 212 formed over the barrier layer by CVD or other suitable deposition process. For example, silane ($SiH_4$) may be used as a chemical gas in the CVD process to form the poly layer 212. The poly layer 212 may include a thickness ranging from about 400 to about 800 angstrom (A). The semiconductor layer may alternatively include an amorphous silicon layer instead of a polysilicon layer.

The method 100 continues with block 108 in which a hard mask layer is formed over the silicon layer. A hard mask layer 230 is formed over the poly layer 212. The hard mask layer 230 may include silicon oxide. The hard mask layer 230 may include a thickness ranging from about 100 to about 400 angstrom (A). Alternatively, the hard mask layer 230 may optionally include silicon oxynitride, and/or other suitable materials. The hard mask layer 230 may be formed using methods such as CVD, PVD, or ALD. Additionally, an anti-reflective coating (ARC) layer (not shown) or bottom anti-reflective coating (BARC) layer (not shown) may be formed on the hard mask layer 230 to enhance a subsequent patterning process as is known in the art. A patterned photoresist layer (not shown) may be formed on the hard mask layer 230. The patterned photoresist layer may include a gate pattern for the nMOS device 206 and a gate pattern for the pMOS device 208. The gate patterns may be formed by photolithography, immersion lithography, ion-beam writing, or other suitable process.

The method 100 continues with block 110 in which the hard mask layer, silicon layer, barrier layer, and high-k dielectric layer are patterned to form a first gate structure over the first region and a second gate structure over the second region. The hard mask layer 230 may be patterned by a dry or wet etching process using the patterned photoresist as a mask, and the patterned hard mask layer may be used to pattern a gate structure 240n of the nMOS device 206 and a gate structure 240p of the pMOS device 208. The gate structures 240n, 240p may be formed by a dry etching or wet etching or combination dry and wet etching process. For example, the dry etching process may use a fluorine-containing plasma (e.g., etch gas includes $CF_4$). Alternatively, the etching process may include multiple etching steps to etch the various gate material layers. The patterned photoresist layer may be removed by a stripping, ashing, or other process.

The gate structure 240n of the nMOS device 206 includes a hard mask layer 230n, a dummy poly gate 212n, a barrier layer (if provided), and a gate dielectric layer 210n (including an interfacial layer and high-k dielectric layer). The gate structure 240p of the pMOS device 208 includes a hard mask layer 230p, a dummy poly gate 212p, a barrier layer (if provided), and a gate dielectric layer 210p (including an interfacial layer and high-k dielectric layer).

Gate or sidewall spacers 242 are formed on sidewalls of the gate structures 240n, 240p. The spacers 242 may include a multi-layer configuration. In the present embodiment, the spacers 242 may be formed of silicon nitride. Alternatively, the spacers 242 may be formed of silicon oxide, silicon oxynitride, silicon carbide, fluoride-doped silicate glass (FSG), a low-k dielectric material, combinations thereof, and/or other suitable material. The spacers 242 may be formed by methods including deposition of suitable dielectric material and anisotropically etching the material to form the spacer 242 profile. A liner layer (not shown) may be formed on the sidewalls of the gate structures 240p, 240n prior to forming the spacers 242. The liner layer may include a dielectric material such as silicon oxide, silicon nitride, and/or other suitable materials.

Source and drain (S/D) regions 246 are formed in the substrate 202. The S/D regions 246 may include lightly doped source/drain regions (LDD) and heavy doped source/drain regions. It should be noted that the LDD regions may be formed prior to formation of the spacers 242. The S/D regions 246 may be formed by implanting p-type or n-type dopants or impurities into the substrate 202 depending on the desired transistor configuration (e.g., pMOS or nMOS). The S/D regions 246 may be formed by methods including photolithography, ion implantation, diffusion, and/or other suitable processes. An annealing process is performed thereafter to activate the S/D regions 246. The annealing process can be implemented by a suitable method, such as rapid thermal annealing (RTA) or mini second annealing. Further, the S/D regions 246 of the pMOS device 208 may include silicon germanium (SiGe), such as at the raised S/D region SiGe features 248. For example, the SiGe features 248 may be formed by an epitaxy process such that the SiGe features can be formed in a crystalline state in the substrate 202. Thus, a strained channel may be achieved in the pMOS device 208 to increase carrier mobility and enhance device performance.

The method 100 continues with block 112 in which an implant process 249 is performed on the device 200 to provide an extra dopant concentration near the surface of the device 200. In an embodiment, the implant process 249 is a boron (B) implant process. The implant process 249 is performed on the device after an SiGe formation (e.g., 246 and/or 248) and before a silicide (e.g. NiSix) deposition (discussed below). This B implant process provides a high surface dopant concentration that is effective in reducing SiGe (contact) resistance (Rs), which in turn, boosts device performance. In an embodiment, the plasma B implant process 249 is a plasma doping implant process performed having an RF source of approximately 2 MHZ and a pulsed DC bias where the pulse frequency is in a range of approximately 0.5-10 KHz. With a precursor (e.g., $B_2H_6$ and/or other similar precursors) and with a dilution gas (e.g., $H_2$, Ar, and/or He), in an embodiment, the pressure is less than approximately 6 mtorr to approximately 200 mtorr, the source RF is less than approximately 1000 W, where a pulsed DC bias is less than approximately 10 KV and a dosage in a range of approximately 1E15-1E18 and the temperature is less than approximately 100 C. In another embodiment, the B implant is performed as a plasma doping implant using parameters of approximately 5% to 10% $B_2H_6$, 90% to 95% $H_2$ at a total flow of approximately 120 sccm to 500 sccm, 6 mtorr, 725 w, 5 KeV 1-1.5 E16 and an anneal condition of approximately 900 C to 1010 C rapid thermal annealing (RTA), which yields a surface B concentration greater than approximately $1 \text{ E } 22$ atoms/cm$^3$. However, it should be understood that other parameters may be used with the present disclosure. For example, in different embodiments, an extra B implant before NiSx formation may be performed using implant tools for a low temperature implant, a cluster implant, and/or a plasma implant to provide an extra B concentration. It is again noted that the plasma implant provides the greatest device performance boost (e.g., ~6% gain) due to surface peak profile, while low temperature and cluster implants provide a smaller device performance boost (e.g., ~2-3% gain).

As shown in FIG. 4, the method 100 continues with block 114 in which after the boron implantation process (e.g., 249), contact features 250, such as silicide (e.g., NiSix), are formed and coupled to the S/D regions 246. The contact features 250 may be formed on the S/D regions 246 and SiGe features 248 by a salicide (self-aligned silicide) process or other process. For example, a metal material may be formed next to silicon structures, then the temperature is raised to anneal and cause a reaction between the underlying silicon and metal material to form silicide, and the un-reacted metal may be etched away. The contacts 250 may include nickel silicide, cobalt silicide, tungsten silicide, tantalum silicide, titanium silicide, platinum silicide, erbium silicide, palladium silicide, or combinations thereof. The hard mask layers 230n, 230p may protect the dummy poly layers 212n, 212p, respectively, from the salicide process.

The method 100 continues with block 116 in the device fabrication is completed using a high-K metal gate, gate last process. As should be understood, such fabrication includes one or more steps, which may include processes described below and/or other processes understood in the art.

For example, a dielectric layer is formed on the device 200. In FIG. 5, a dielectric layer 270 such as an inter-layer (or level) dielectric (ILD) layer may be formed overlying the gate structures 240p, 240n. The dielectric layer 270 substantially fills in the gap between adjacent devices 206 and 208. The dielectric layer 270 may be formed by a HDP-CVD, spin-on, sputtering, or other suitable methods. In an embodiment, the dielectric layer 270 includes a HDP dielectric material (e.g., HDP oxide). The HDP-CVD process includes a low sputtering HDP-CVD process. Alternatively, the dielectric layer 270 may optionally include a spin-on-glass (SOG) or high aspect ration process (HARP) dielectric material. Further, the dielectric layer 270 may comprise a dielectric material, such as silicon oxide, silicon nitride, silicon oxynitride, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric materials, other suitable dielectric materials, and/or combinations thereof.

A chemical mechanical polishing (CMP) is performed on the ILD 270. In a gate last process, the dummy poly gates 212p, 212n may be removed so that metal gate structures may be formed to replace of the dummy poly gates. Accordingly, the dielectric layer 270 is planarized by a chemical mechanical polishing (CMP) process until a top portion of the dummy poly gates 212n, 212p of the nMOS 206 device and pMOS device 208, respectively, are reached or exposed. For example, the CMP process may polish the dielectric layer 270 and hard mask layers 230n, 230p exposing both dummy poly gates 212n, 212p.

The poly silicon layers are removed from the first and second gate structures, respectively, thereby forming a first trench and a second trench. In other words, following the CMP process, the dummy poly gates 212n, 212p of the gate structures 240n, 240p are removed. In an embodiment, polysilicon is selectively etched removing the dummy poly gates 212n, 212p. The selective removal of the dummy poly gates 212n, 212p provides trenches within which metal gates may be formed. The dummy poly gates 212n, 212p may be removed using a wet etch and/or a dry etch. In an embodiment, a wet etch process includes exposure to a hydroxide containing solution (e.g., ammonium hydroxide), deionized water, and/or other suitable etchant solutions.

A first metal layer is formed to substantially fill the first trench. For example, a metal layer 274 is deposited to fill in the trench that contained 212p. The metal layer 274 may include any metal material suitable for forming a metal gate or portion thereof, including work function layers, liner layers, interface layers, seed layers, adhesion layers, barrier layers, etc. The metal layer 274 may be formed by PVD, CVD, or other suitable processes. The metal layer 274 may include a P-type work function metal (P-metal) to provide a gate electrode that properly performs in the pMOS device 208. P-metal materials include TiN, WN, TaN, conductive metal oxides, and/or other suitable materials. The metal layer 274 may further include a fill metal layer formed on the work function metal layer. The fill metal layer may include aluminum (Al) or tungsten (W), or other suitable materials. In an embodiment, the fill metal may include a Ti layer that functions as a wetting layer and an Al layer to fill in the remainder of the trench. The fill metal layer may be deposited using CVD, PVD, plating, or other suitable process. A CMP process may be performed to planarize the semiconductor device 200. The CMP process may remove the metal layer 274 outside of the trench and provides the semiconductor device 200 with a P-metal gate structure.

A second metal layer is formed to substantially fill the second trench. For example, a metal layer 278 is deposited to fill in the trench that contained 212n. The metal layer 278 may include any metal material suitable for forming a metal gate or portion thereof, including work function layers, liner layers, interface layers, seed layers, adhesion layers, barrier layers, etc. The metal layer 278 may be formed by PVD, CVD, or other suitable processes. The metal layer 278 may include a N-type work function metal (N-metal) to provide a gate electrode that properly performs in the nMOS device 206. N-type metal materials may include compositions such as TiAl, TAlN, other aluminides, and/or other suitable materials. The metal layer 278 may further include a fill metal layer formed on the work function metal layer. The fill metal layer may include aluminum (Al) or tungsten (W), or other suitable materials. In an embodiment, the fill metal may include a Ti layer that functions as a wetting layer and an Al layer to fill in the remainder of the trench. The fill metal layer may be deposited using CVD, PVD, plating, or other suitable process. A CMP process may be performed to planarize the semiconductor device 200. The CMP process may remove the metal layer 278 outside of the trench and provides the semiconductor device 200 with an N-metal gate structure. It should be understood that the N-metal may be formed first followed by the P-metal in some embodiments. Also, it is understood that during the formation of the metal gates for the nMOS device 206 and pMOS device 208, N/P patterning may be implemented to separate one type of device from the other, and vice versa.

In embodiments, the method 100 may continue to include additional process steps such as formation of contacts, interconnect structures (e.g., lines and vias, metal layers, and interlayer dielectric that provide electrical interconnection to the device including the formed metal gate), passivation layers, etc. For example, a multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure.

As should be understood, a gate last process may be implemented as described herein to form metal gate structures. However, other types of devices (e.g., finFET devices, planar devices, etc.) may be formed using processes as described herein. The methods disclosed herein can be easily integrated with a CMOS process flow and do not require additional complex steps to achieve the desired results. It is understood that embodiments disclosed herein offer different advantages, and that no particular advantage is necessarily required for all embodiments.

Accordingly, the present disclosure provides a device and method that includes a high surface dopant concentration semiconductor device. While the preceding description shows and describes one or more embodiments, it will be understood by those skilled in the art that various changes in form and detail may be made therein without departing from the spirit and scope of the present disclosure. For example, although the methods implements a "gate last" approach, the methods disclosed herein may be used in a hybrid process in which one type of metal gate is formed in a "gate first" process flow and the other type of metal gate is formed in a "gate last" process flow. Therefore, the claims should be interpreted in a broad manner, consistent with the present disclosure.

What is claimed is:

1. A method of forming a semiconductor device, the method comprising:
    providing a substrate;
    forming a doped region in the substrate;
    forming a stressing layer over the doped region;
    performing a boron (B) doping implant to the stressing layer;
    annealing the B doping implant; and
    after annealing the B doping implant, forming a silicide layer over the stressing layer.

2. The method of claim 1, forming the stressing layer using silicon germanium (SiGe).

3. The method of claim 1, forming the silicide layer using nickel silicide (NiSix).

4. The method of claim 1, performing the boron doping implant as a plasma implant process.

5. The method of claim 4, performing the plasma implant process using a precursor gas comprising B2H6 and a dilution gas comprising H2, Ar, He, and combinations thereof.

6. The method of claim 5, performing the plasma implant process using the gas comprising B2H6 and H2 in a proportion range of approximately 5%-10% B2H6 and approximately 90%-95% H2.

7. The method of claim 1, performing the annealing as a rapid thermal annealing (RTA) process at a temperature range of approximately 900 C-1010 C.

8. A method of for increasing surface dopant concentration in a semiconductor device, the method comprising:
    providing a substrate;
    forming a dummy gate structure on the substrate, wherein the dummy gate structure includes a dummy gate;
    forming a doped region in the substrate, wherein a first portion of the doped region is below a portion of the dummy gate structure and a second portion of the doped region is not below the portion of the dummy gate structure;
    forming a stressing layer over the doped region;
    performing a boron (B) doping implant to the stressing layer;
    annealing the B doping implant;
    after annealing the B doping implant, forming a silicide layer over the stressing layer; and
    replacing the dummy gate with a metal gate.

9. The method of claim 8, forming the stressing layer using silicon germanium (SiGe), wherein the doped region is a source or a drain region.

10. The method of claim 8, forming the silicide layer as a contact device using nickel silicide (NiSix).

11. The method of claim 8, performing the boron doping implant as a plasma implant process having a source RF of approximately 2 MHz and a pulsed DC bias having a pulse frequency in a range of approximately 0.5 KHz-10 KHz.

12. The method of claim 11, performing the plasma implant process using a precursor gas comprising B2H6 and a dilution gas comprising H2, Ar, He, and combinations thereof at a pressure range of approximately 6 mtorr to 200 mtorr.

13. The method of claim 12, performing the plasma implant process using the gas comprising B2H6 and H2 in a proportion range of approximately 5%-10% B2H6 and approximately 90%-95% H2.

14. The method of claim 8, performing the annealing as a rapid thermal annealing (RTA) process.

* * * * *